(12) United States Patent
Francis et al.

(10) Patent No.: US 11,183,992 B1
(45) Date of Patent: Nov. 23, 2021

(54) ANALOG INPUT BUFFER

(71) Applicant: Xilinx, Inc., San Jose, CA (US)

(72) Inventors: Roswald Francis, Dublin (IE); Bruno Miguel Vaz, Alcabideche (PT)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/852,729

(22) Filed: Apr. 20, 2020

(51) Int. Cl.
*H03K 5/02* (2006.01)
*H03K 5/1252* (2006.01)

(52) U.S. Cl.
CPC .............. *H03K 5/1252* (2013.01); *H03K 5/02* (2013.01)

(58) Field of Classification Search
CPC .................................................. H03K 5/1252
See application file for complete search history.

(56) References Cited

U.S. PATENT DOCUMENTS 7,411,430 B2 * 8/2008 Cheng .................. G09G 3/3685
327/108
7,622,964 B2 * 11/2009 Matsuoka ............... H03F 3/505
326/82

OTHER PUBLICATIONS

Duisters, et al., "A-90-dB THD Rail-to-Rail Input Opamp Using a New Local Charge Pump in CMOS," IEEE Journal of Solid-State Circuits, vol. 33, No. 7, Jul. 1998, pp. 947-955.

* cited by examiner

*Primary Examiner* — Hai L Nguyen
(74) *Attorney, Agent, or Firm* — Paradice and Li LLP

(57) ABSTRACT

A signal buffer is disclosed. The signal buffer may include one or more bias signal generators to bias one or more transistors. The bias signal generators may generate power supply compensated or ground compensated bias signals. The bias signal generators may include a capacitor to provide a high frequency signal path.

9 Claims, 6 Drawing Sheets

ANALOG INPUT BUFFER

TECHNICAL FIELD

Aspects of the present disclosure relate generally to analog input buffers, and more specifically to analog input buffers with improved power supply noise rejection.

BACKGROUND

Many modern circuits receive one or more analog signals for processing, filtering, amplification and the like. For example, an analog signal may be buffered for sampling by an analog-to-digital converter (ADC). Some analog signals are distributed in a differential format including two complementary signals where an electrical difference between the signals represents the analog signal. Analog signals are generally received through an input buffer to provide isolation and possible gain prior to further processing. In some cases, power supply noise may affect input buffer performance by directly or indirectly affecting the input buffer output signal. Therefore, input buffers with increased power supply noise rejection are very desirable.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter. Moreover, the systems, methods and devices of this disclosure each have several innovative aspects, no single one of which is solely responsible for the desirable attributes disclosed herein.

One innovative aspect of the subject matter described in this disclosure can be used to buffer signals. In some implementations, a CMOS signal buffer may include a first transistor, a second transistor, a third transistor, a fourth transistor, a first capacitor and a second capacitor. The first transistor may include a source coupled to a power supply. The second transistor may be configured to couple a gate of the first transistor to an input node. The third transistor may include a source coupled to ground and a drain coupled to the drain of the first transistor. The fourth transistor may be configured to couple a gate of the third transistor to the input node. The first capacitor may include a first terminal coupled to a source of the second transistor and a second terminal coupled to a drain of the second transistor. The second capacitor may include a first terminal coupled to a source of the fourth transistor and a second terminal coupled to a drain of the fourth transistor.

Another innovative aspect of the subject matter described in this disclosure can be implemented as another CMOS signal buffer. In some implementations, the CMOS signal buffer may include a first resistor, a second resistor, a first transistor, a second transistor, and a first capacitor. The first resistor may include a first terminal coupled to a first node and a second terminal configured to receive an input signal. The first transistor may include a source coupled to a supply voltage and a drain coupled to a second node. The second transistor may include a source coupled to a gate of the first transistor and a drain coupled to the first node. The first capacitor may include a first terminal coupled to the source of the second transistor and a second terminal coupled to the drain of the second transistor. The second resistor may include a first terminal coupled to the first node and a second terminal coupled to the second node, wherein the second node is configured to provide an output signal.

BRIEF DESCRIPTION OF THE DRAWINGS

The example implementations described herein are illustrated by way of example and are not intended to be limited by the figures of the accompanying drawings. Like numbers reference like elements throughout the drawings and specification. Note that the relative dimensions of the following figures may not be drawn to scale.

DETAILED DESCRIPTION

Implementations of the subject matter described in this disclosure may be used to buffer analog signals. In some implementations, an analog signal buffer may generate one or more power supply-compensated bias signals to control operation of one or more transistors that, in turn, generate an output signal. Still further, in some implementations, generation of the power supply-compensated bias signals may include a capacitor to provide a high frequency signal path.

Particular implementations of the subject matter described in this disclosure can be implemented to realize one or more of the following potential advantages. Signal buffers using the power supply-compensated bias signals may have reduced sensitivity to power supply and ground noise. Still further, aspects of the present disclosure may increase the stability of some signal buffers.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example implementations. However, it will be apparent to one skilled in the art that these specific details may not be required to practice the example implementations. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example implementations are not to be construed as limited to specific examples described herein but rather to include within their scope all implementations defined by the appended claims.

Figure 1:
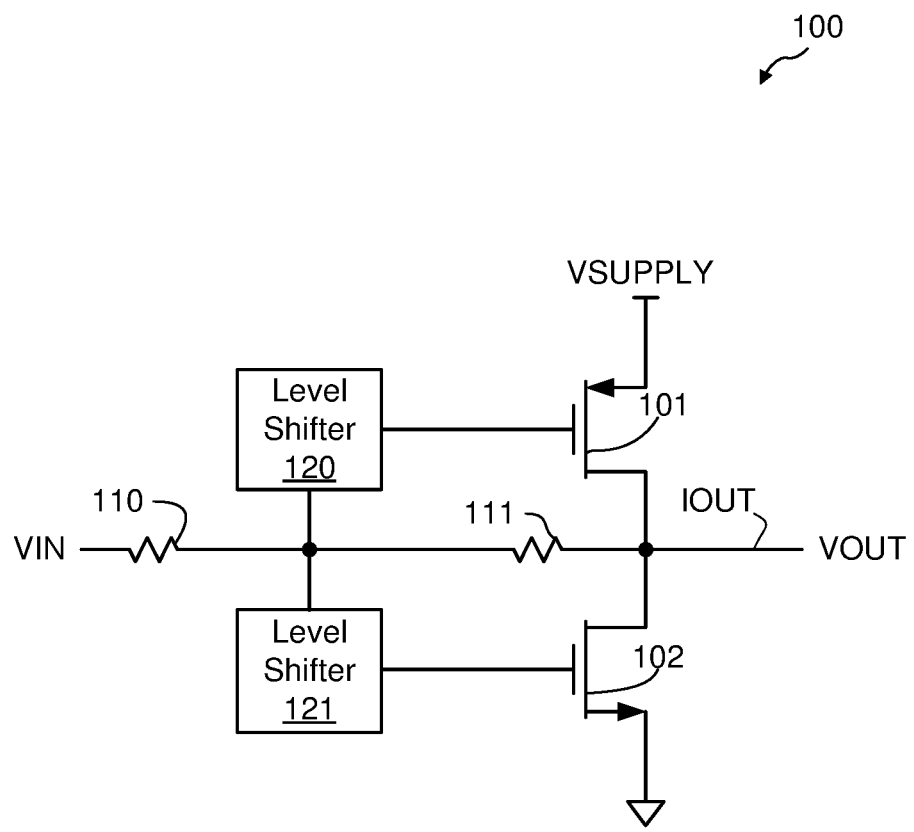
FIG. 1 shows a simplified circuit diagram of a conventional input buffer.

FIG. 1 shows a simplified circuit diagram of a conventional input buffer 100. The input buffer 100 may include transistors 101 and 102, resistors 110 and 111, and level shifters 120 and 121. As shown, the input buffer 100 may receive an input signal VIN and generate an output signal VOUT. In some implementations, the input buffer 100 may be used to buffer differential signals. In such implementations, the input buffer 100 may be instantiated twice, such that each instantiation can buffer one-half of a differential signal.

In some implementations, transistor 101 may be a PMOS transistor, transistor 102 may be an NMOS transistor, and the input buffer 100 may operate as a CMOS buffer or inverter. As shown, drain terminals of transistor 101 and transistor 102 may be coupled together. The source of transistor 101 may be coupled to a power supply (VSUPPLY), and the source of transistor 102 may be coupled to ground. The gate of the transistor 101 may be coupled to an output terminal of the first level shifter 120, and the gate of the transistor 102 may be coupled to an output terminal of the second level shifter 121.

In other implementations, the transistors 101 and 102 may be any feasible transistor type. For example, transistor 101 may be an NMOS transistor and transistor 102 may be a PMOS transistor. In some other implementations, the transistors 101 and 102 may be the same transistor type (e.g., both NMOS or PMOS transistors). In addition, the input buffer 100 may include additional transistors not shown for simplicity. For example, one or more additional transistors may be used to provide bias currents and/or voltages for the input buffer 100. Further, in other implementations, other terminals of the transistors 101 and 102 may be coupled together.

The resistor 110 may be an input resistor, and the resistor 111 may be a feedback resistor. As shown, the resistor 110 may receive the input signal VIN and provide the input signal VIN to the gates of the transistor 101 and the transistor 102 via the level shifter 120 and the level shifter 121, respectively. In some implementations, the resistors 110 and 111 may affect a gain of the input buffer 100. For example, the gain of the input buffer 100 may be represented by a ratio of the resistance value of the resistor 111 to the resistance value of the resistor 110. Thus, in some implementations, the input buffer 100 may provide gain, attenuation, or unity gain based on the ratio of the resistance values of the resistors 110 and 111.

The level shifters 120 and 121 may move, transpose, or "level-shift" the input signal VIN to an appropriate voltage for operation of the transistors 101 and 102. Thus, the level shifter 120 may level-shift the voltage of VIN for operation of the transistor 101, and the level shifter 121 may level-shift the voltage of VIN for operation of the transistor 102.

Power to the input buffer 100 may be provided by VSUPPLY and returned to ground. Thus, the source of the transistor 101 is coupled to VSUPPLY, and the source of the transistor 102 is coupled to ground. In other implementations, power (VSUPPLY and ground) may be coupled to other terminals and/or devices.

An output signal of the input buffer 100 may be expressed as a polynomial that is a function of the input voltage and the power supply. For example, the output current IOUT of the input buffer 100 may be expressed as:

$$IOUT = a_0 + a_1 x + a_2 x^2 + a_3 x^3 \quad \text{(eq. 1)}$$

where $a_0$-$a_n$ are constants, and x is a combination of the input voltage VIN and the power supply voltage VSUPPLY. Thus, x may be expressed as:

$$x = (VIN + (k \cdot VSUPPLY)) \quad \text{(eq. 2)}$$

Further, $x^2$ may be expressed as:

$$x^2 = VIN^2 + k^2 VSUPPLY^2 + 2k(VIN)(VSUPPLY) \quad \text{(eq. 3)}$$

Similar expressions may be determined for $x^3$ and other higher order terms not shown or discussed herein for simplicity. Thus, the power supply voltage VSUPPLY may affect the output current IOUT linearly (e.g., as shown in the $a_1$ term) and non-linearly (e.g., as shown in the $a_2$ and $a_3$ terms) in accordance with equation 1. Therefore, compensating or adjusting the operation of the input buffer 100 based on the power supply voltage may reduce power supply related noise in the output current. Similar equations not expressed here may show a similar reduction of power supply related noise in the output voltage (VOUT) of the input buffer 100.

Figure 2:
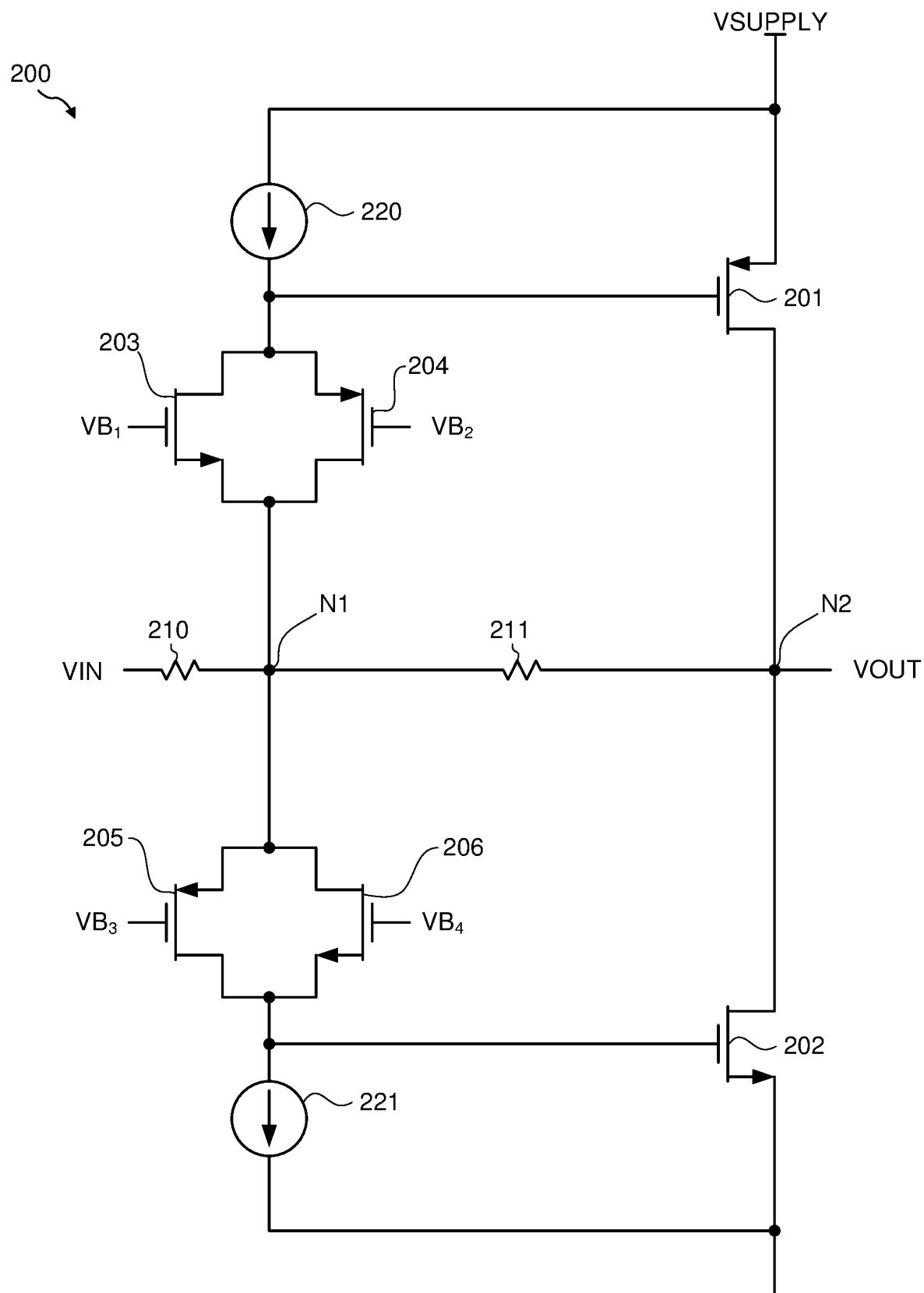
FIG. 2 shows a simplified circuit diagram of a supply-compensated signal buffer.

FIG. 2 shows a simplified circuit diagram of a supply-compensated signal buffer 200. In some implementations, two instances of the supply-compensated signal buffer 200 may be used to implement a differential signal buffer (not shown for simplicity) The supply-compensated signal buffer 200 may receive an input signal VIN and may generate an output signal VOUT. In some implementations, the supply-compensated signal buffer 200 may operate as a class A/B output stage.

The supply-compensated signal buffer 200 may include transistors 201-206, resistors 210 and 211, and current sources 220 and 221. Transistors 201, 204 and 205 may be PMOS transistors and transistors 202, 203, and 206 may be NMOS transistors. In other implementations, transistors 201-206 may be complementary transistors (e.g., PMOS transistors may be NMOS transistors and vice versa), bipolar transistors, junction gate field effect transistors (JFETs), or any other feasible type of transistor. Transistors 201 and 202 are coupled in series between the power supply (VSUPPLY) and ground. The drains of transistors 201 and 202 may be coupled together at an output node N1 and provide the output signal VOUT. The source of transistor 201 may be coupled to VSUPPLY and the source of transistor 202 may be coupled to ground.

The current source 220 and transistor 204 may bias the transistor 201 for linear operation. A first terminal of the current source 220 may be coupled to VSUPPLY and a second terminal of the current source 220 may be coupled to the source of transistor 204. The gate of transistor 204 may be coupled to bias voltage $VB_2$. Bias voltage generation, including the bias voltage $VB_2$, is described in more detail with respect to FIGS. 3-5.

In a similar manner, the current source 221 and transistor 206 may bias transistor 202 for linear operation. A first terminal of the current source 221 may be coupled to ground and a second terminal of the current source 221 may be coupled to the source of transistor 206. The gate of transistor 206 may be coupled to bias voltage $VB_4$. The drain of transistor 204 may be coupled to the drain of transistor 206 through an input node N1.

In some implementations, transistor 203 and transistor 205 may operate as a floating current source. The drain of transistor 203 may be coupled to the source of transistor 204. The source of transistor 203 may be coupled to the input node N1. The drain of transistor 205 may be coupled to the source of transistor 206. The source of transistor 205 may be coupled to the input node N1. The gate of transistor 203 may be coupled to bias voltage $VB_1$ and the gate of transistor 205 may be coupled to bias voltage $VB_3$.

Resistor 211 may operate as a feedback resistor by feeding back at least a portion of the signal from an output node N2 to the input node N1, thereby causing the input node N1 to operate as virtual ground. In addition, the resistor 210 may operate as an input resistor coupling an input signal to the input node N1.

Figure 3:
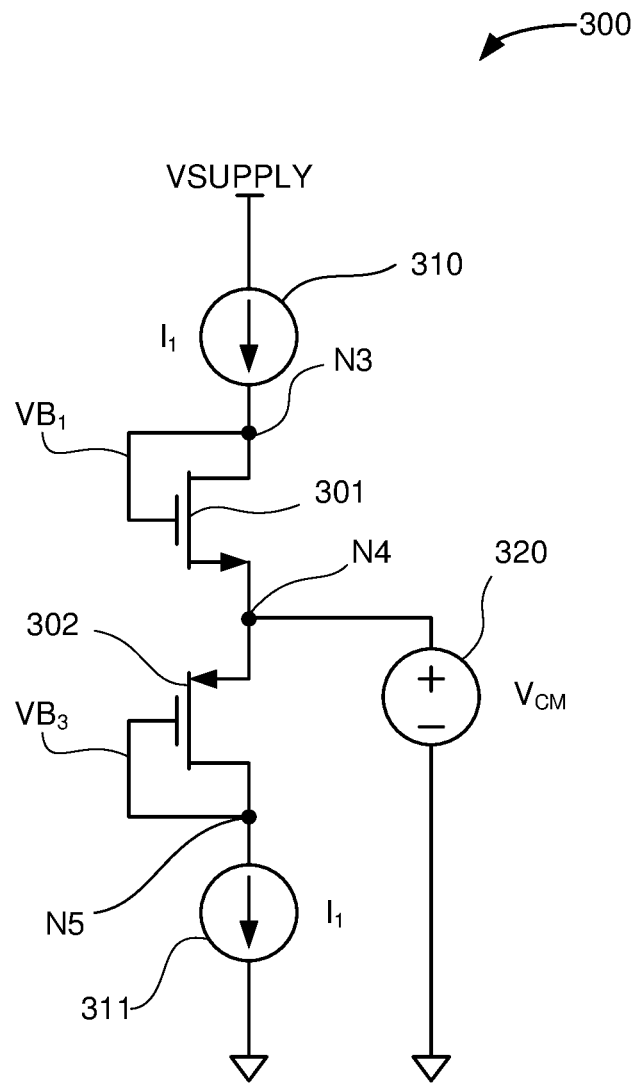
FIG. 3 shows a simplified schematic diagram of a first bias circuit.

FIG. 3 shows a simplified schematic diagram of a first bias circuit 300. The first bias circuit 300 may include transistor 301, transistor 302, a current source 310, a current source 311, and a voltage source 320. Transistor 301 may be an NMOS transistor and transistor 302 may be a PMOS transistor. In other implementations, the transistors 301 and 302 may be any feasible type of transistor. In some implementations, the first bias circuit 300 may bias the floating current source (e.g., transistors 203 and 205) of the supply-compensated signal buffer 200 of FIG. 2.

A first terminal of the current source 310 may be coupled to VSUPPLY and a second terminal of the current source 310 may be coupled to the drain and the gate of transistor 301 at node N3. The source of transistor 301 may be coupled to the source of transistor 302 at node N4. The gate of transistor 302 may be coupled to the drain of transistor 302 and a first terminal of the current source 311 at node N5. A second terminal of the current source 311 may be coupled to ground.

The voltage source 320 may be coupled between the node N4 and ground. In some implementations, the voltage source 320 may set the node N4 to a common mode voltage (such as when the supply-compensated signal buffer 200 is part of a differential input buffer). With reference for example to FIG. 2, the node N3 may provide the bias voltage $VB_1$ for transistor 203 and the node N5 may provide the bias voltage $VB_3$ for the transistor 205.

Figure 4:
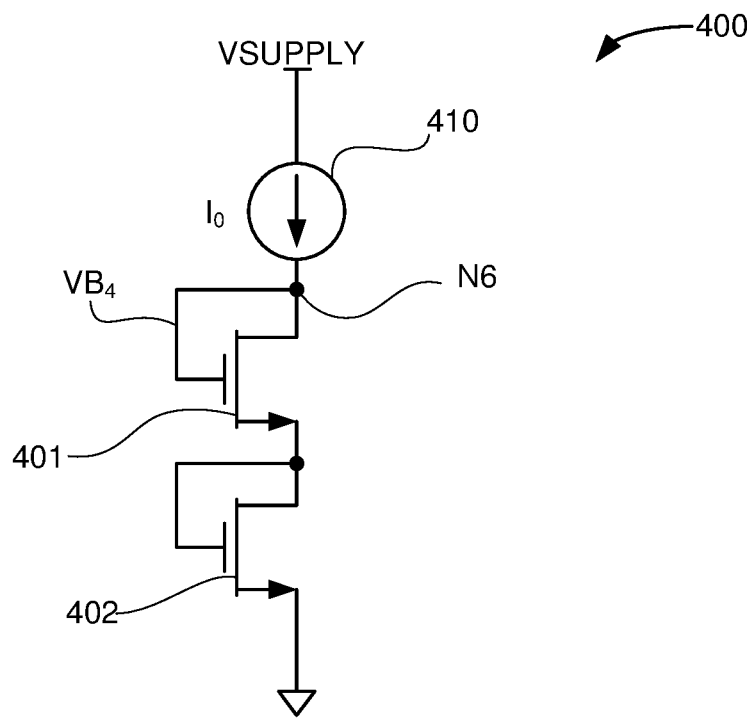
FIG. 4 shows a simplified schematic diagram of a second bias circuit.

FIG. 4 shows a simplified schematic diagram of a second bias circuit 400. The second bias circuit 400 may include transistor 401, transistor 402, and a current source 410. As shown, transistor 401 and transistor 402 are NMOS transistors. In other implementations, transistor 401 and transistor 402 may be any other feasible type of transistor. A first terminal of the current source 410 may be coupled to VSUPPLY and a second terminal of the current source 410 may be coupled to the gate and the drain of transistor 401 at node N6. The source of transistor 401 may be coupled to the gate and the drain of transistor 402. The source of transistor 402 may be coupled to ground.

With reference for example to FIG. 2, node N6 may provide the bias voltage $VB_4$ for transistor 206. As described with respect to FIG. 2, transistor 206 may control the operation of transistor 202. Since transistors 401 and 402 are diode connected transistors, the voltage at node N6 automatically tracks any changes in ground, thereby reducing the ground sensitivity of the transistor 202 and increasing a ground supply noise rejection ratio (GSRR) of the supply-compensated signal buffer 200.

Figure 5:
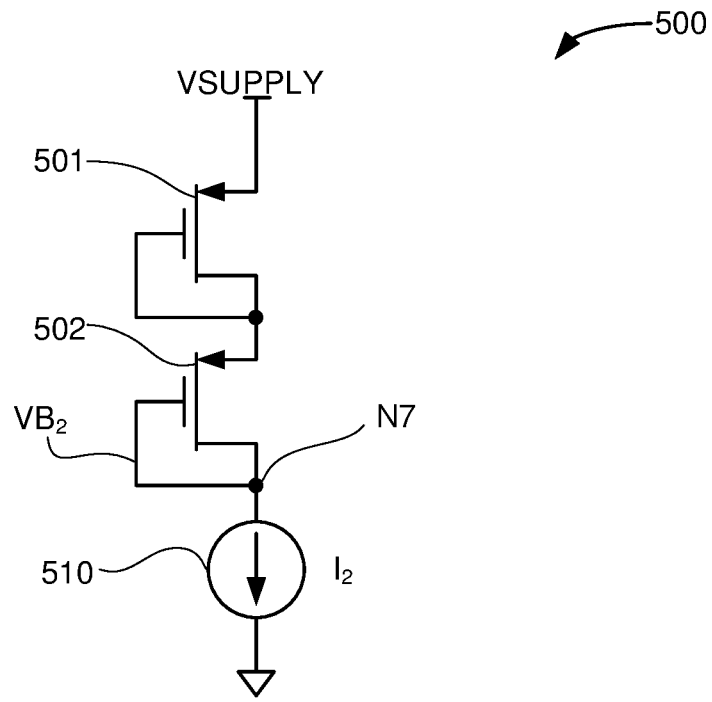
FIG. 5 shows a simplified schematic diagram of a third bias circuit.

FIG. 5 shows a simplified schematic diagram of a third bias circuit 500. The third bias circuit 500 may include transistor 501, transistor 502, and a current source 510. As shown, transistor 501 and transistor 502 are PMOS transistors. In other embodiments, transistor 501 and transistor 502 may be any other feasible type of transistor. The source of transistor 501 is coupled to VSUPPLY. The gate and drain of transistor 501 are coupled to the source of transistor 502. The gate and drain of transistor 502 are coupled to a first terminal of the current source 510 at node N7. A second terminal of the current source 510 is coupled to ground.

With reference for example to FIG. 2, node N7 may provide the bias voltage $VB_2$ for transistor 204. As described with respect to FIG. 2, transistor 204 may control the operation of transistor 201. Since transistors 501 and 502 are diode connected transistors, the voltage at node N7 automatically tracks any changes in VSUPPLY, thereby reducing voltage sensitivity of the transistor 201 and increasing a power supply noise rejection ratio (PSRR) of the supply-compensated signal buffer 200.

Figure 6:
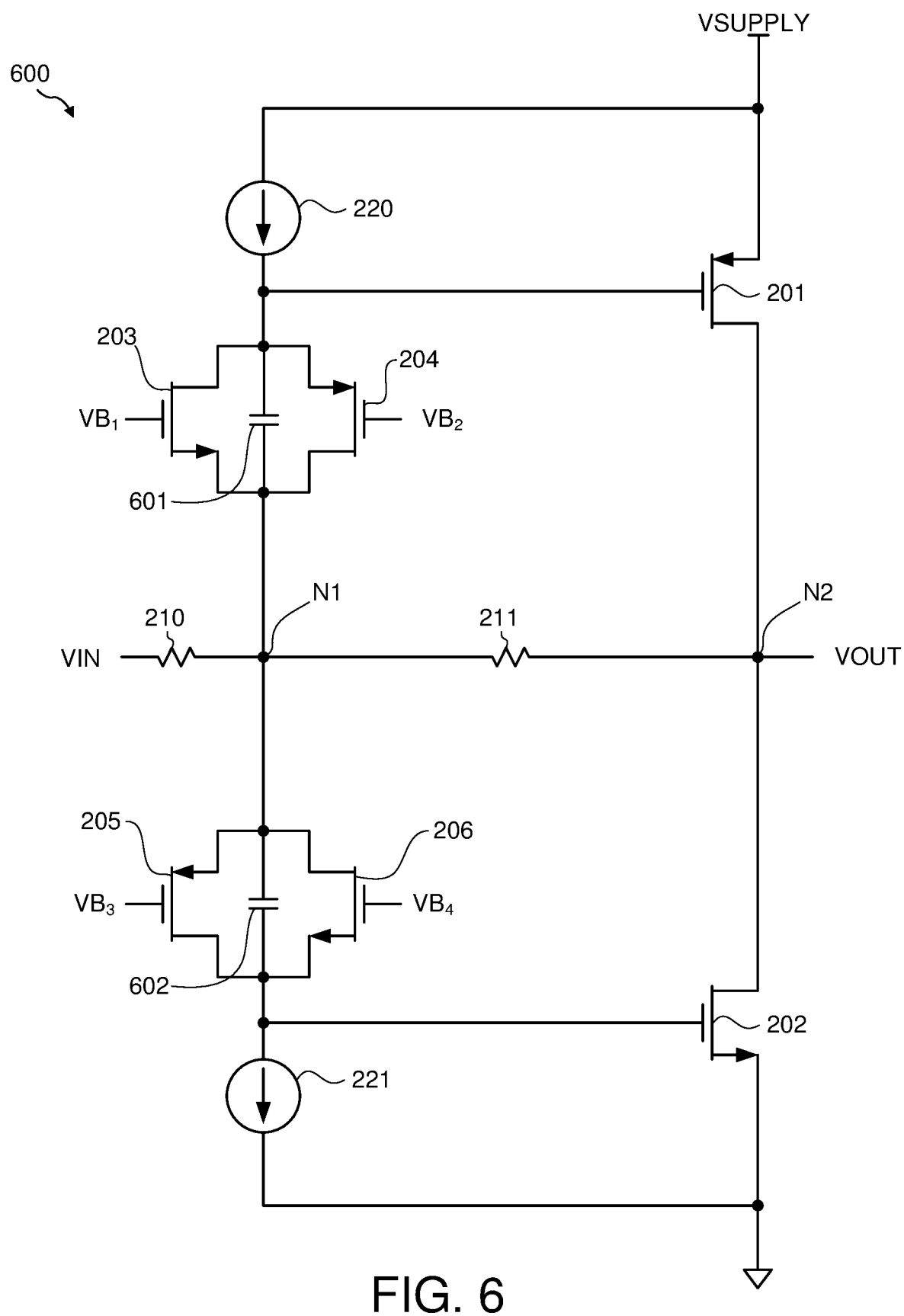
FIG. 6 shows another simplified circuit diagram of supply-compensated signal buffer.

FIG. 6 shows another simplified circuit diagram of a supply-compensated signal buffer 600. The supply-compensated signal buffer 600 may be another implementation of the supply-compensated signal buffer 200 shown in FIG. 2. The supply-compensated signal buffer 600 may include the transistors 201-206, the resistors 210 and 211, and the current sources 220 and 221 configured as described with respect to FIG. 2. In addition, the supply-compensated signal buffer 600 may include capacitors 601 and 602.

The capacitor 601 may be coupled between the source and drain of transistors 203 and 204. In the example of FIG. 6, a first terminal of the capacitor 601 may be coupled to the drain of transistor 203 and the source of transistor 204. A second terminal of the capacitor 601 may be coupled to a drain of transistor 204 and a source of transistor 203. As discussed with respect to FIG. 2, transistors 203 and 204 may be implemented with any feasible transistor. Therefore, in other implementations, the capacitor 601 may be coupled to any feasible terminals of the transistors 203 and 204.

In a similar manner, the capacitor 602 may be coupled between the source and drain terminals of transistor 205 and 206. In the example of FIG. 6, a first terminal of the capacitor 602 may be coupled to the drain of transistor 206 and the source of transistor 205. A second terminal of the capacitor 602 may be coupled to a drain of transistor 205 and a source of transistor 206. As discussed with respect to FIG. 2, transistors 205 and 206 may be implemented with any feasible transistor. Therefore, in other implementations, the capacitor 602 may be coupled to any feasible terminals of the transistors 205 and 206.

In some implementations, the capacitors 601 and 602 may reduce distortion, including harmonic distortion, at high frequencies. In some other instances, the capacitors 602 and 601 may improve the stability (e.g., the ability to avoid self-oscillation) of the supply-compensated signal buffer 600 by introducing zeros between a virtual ground and gates of the transistors 201 and 202. In still other instances, the capacitors 601 and 602 may provide a high frequency signal path between source and drain terminals of the associated transistors. For example, the capacitor 601 may provide a high frequency signal path between the source and drain terminals of transistors 203 and 204. Similarly, the capacitor 602 may provide a high frequency signal path between the source and drain terminals of the transistors 205 and 206.

In some implementations, as the frequency of the input signal VIN increases, attenuation of signals present at the gates of the transistors 201 and 202 may also increase, thereby reducing loop gain and open loop bandwidth of the supply-compensated signal buffer 600. The capacitors 601 and 602, in combination with the transistors 203 and 205, respectively, may counteract or compensate for this signal reduction by increasing signal amplitude of the signals provided to the gates of the transistors 201 and 202. Increasing these signals may increase gain (e.g., open loop gain), bandwidth (e.g., open loop bandwidth), and phase margin of the supply-compensated signal buffer 600 particularly with respect to high frequency input signals.

In some implementations, the value c of the capacitors 601 and 602 may be based on the transconductance $g_m$ of the transistors 203 and 205 and of a frequency f close to the open loop bandwidth of the supply-compensated signal buffer 600. The capacitance c may be expressed as:

$$c > \frac{g_m}{2\pi f} \quad \text{(eq. 4)}$$

Figure 7:
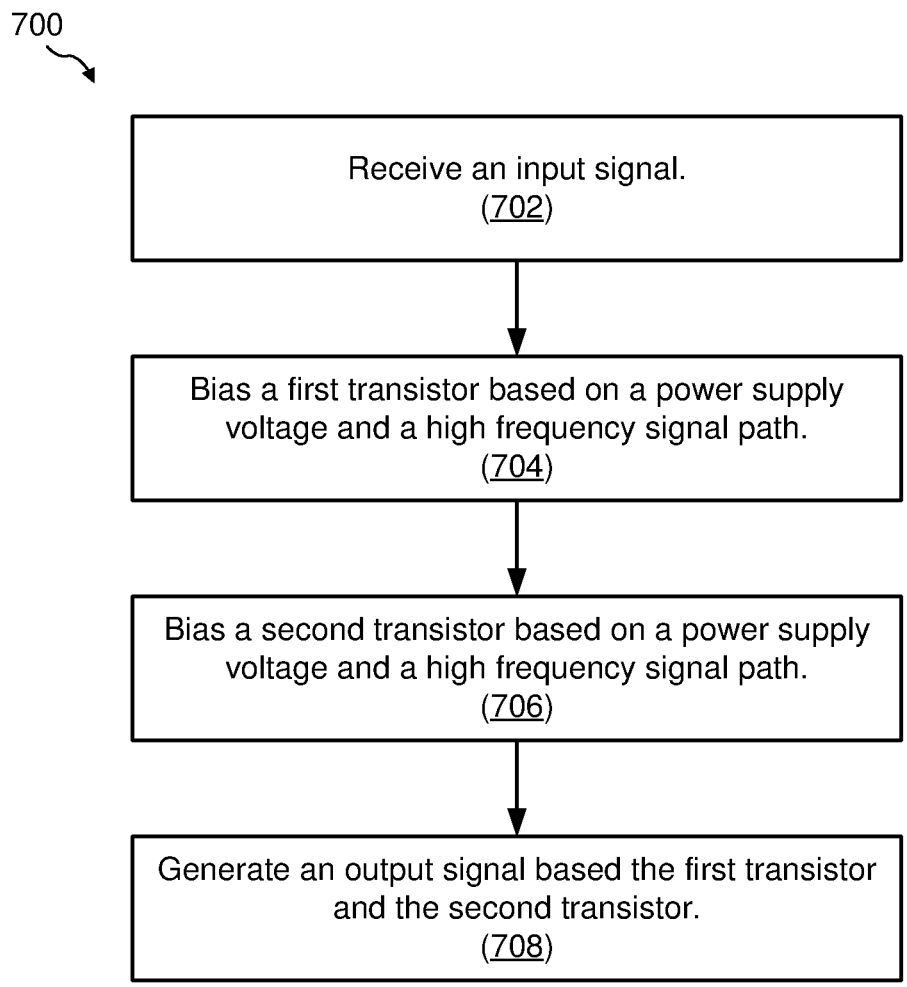
FIG. 7 shows an illustrative flowchart depicting an example operation 700 for operating a supply-compensated input buffer.

FIG. 7 shows an illustrative flowchart depicting an example operation 700 for operating a supply-compensated input buffer. The operation 700 may be used to operate the supply-compensated signal buffer 600 of FIG. 6 or any other feasible supply-compensated input buffer. In some implementations, the operation described herein may include additional processes, fewer processes, processes in a different order, processes in parallel, and/or some processes that are different.

The supply-compensated signal buffer 600 may begin by receiving an input signal (702). In some implementations, the input signal may be received through a first resistor coupled to an input node. In some other implementations, the input signal may be a differential signal.

The supply-compensated signal buffer 600 may bias a first transistor based on a power supply voltage and a high frequency signal path (704). For example, transistor 201 may be biased at least in part by transistor 204 and the capacitor 601. The transistor 204 may be biased by a power supply-compensated bias voltage provided by the third bias circuit 500 of FIG. 5. The capacitor 601 may bypass the impedance ($1/g_m$) associated with the transistor 203 for high-frequency signals.

The supply-compensated signal buffer 600 may bias a second transistor based on a power supply voltage and a high frequency signal path (706). For example, the transistor 202 may be biased at least in part by transistor 206 and the capacitor 602. The transistor 206 may be biased by a power supply-compensated bias voltage provided by the second bias circuit 400 of FIG. 4. The capacitor 602 may bypass the impedance ($1/g_m$) associated with the transistor 205 for high-frequency signals.

The supply-compensated signal buffer 600 may generate an output signal based on the first transistor and the second transistor (708). For example, the supply-compensated signal buffer 600 may generate the output signal VOUT through a second resistor at an output node based on buffering, amplifying, or attenuating the input signal VIN. In some implementations, the gain of the supply-compensated signal buffer 600 may be based on a ratio of first and second resistor values. In some other implementations, the output signal VOUT may be a differential signal.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example implementations have been described with reference to specific example implementations thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A CMOS signal buffer, comprising:
   a first transistor having a source coupled to a power supply;
   a second transistor configured to couple a gate of the first transistor to an input node;
   a first capacitor coupled between a source of the second transistor and a drain of the second transistor;
   a third transistor having a source coupled to ground and a drain coupled to a drain of the first transistor;
   a fourth transistor configured to couple a gate of the third transistor to the input node;
   a second capacitor coupled between a source of the fourth transistor and a drain of the fourth transistor;
   a first bias circuit, comprising:
   a fifth transistor having a source, a gate, and a drain, wherein the source of the fifth transistor is coupled to ground and the gate of the fifth transistor is coupled to the drain of the fifth transistor; and
   a sixth transistor having a source, a gate, and a drain, wherein the source of the sixth transistor is coupled to the drain of the fifth transistor and the gate of the sixth transistor is coupled to the drain of the sixth transistor and the gate of the fourth transistor; and
   a second bias circuit comprising:
   a seventh transistor having a source, a gate, and a drain, wherein the source of the seventh transistor is coupled to a power supply and the gate of the seventh transistor is coupled to the drain of the seventh transistor; and
   an eighth transistor having a source, a gate, and a drain, wherein the source of the eighth transistor is coupled to the drain of the seventh transistor and the gate of the eighth transistor is coupled to the drain of the eighth transistor and the gate of the second transistor.

2. The CMOS signal buffer of claim 1, wherein the first capacitor is configured to provide a high frequency signal path between the source and the drain of the second transistor.

3. The CMOS signal buffer of claim 2, wherein the second capacitor is configured to provide a high frequency signal path between the source and the drain of the fourth transistor.

4. The CMOS signal buffer of claim 3, wherein capacitance values of the first capacitor and the second capacitor are based at least in part on transconductances of the first transistor and the third transistor.

5. The CMOS signal buffer of claim 3, wherein the first capacitor and the second capacitor are configured to increase an open loop bandwidth of the CMOS signal buffer.

6. The CMOS signal buffer of claim 3, wherein the first capacitor and the second capacitor are configured to increase a phase margin of the CMOS signal buffer.

7. The CMOS signal buffer of claim 1, further comprising:
a first resistor configured to couple an input signal to the input node; and
a second resistor configured to couple the input node to the drains of the first and third transistors.

8. The CMOS signal buffer of claim 1, further comprising:
a ninth transistor configured to couple the gate of the first transistor to the input node; and
a tenth transistor configured to couple the gate of the third transistor to the input node.

9. A CMOS signal buffer, comprising:
a first resistor having a first terminal coupled to a first node and a second terminal configured to receive an input signal;
a first transistor having a source coupled to a supply voltage and a drain coupled to a second node;
a second transistor having a source coupled to a gate of the first transistor and a drain coupled to the first node;
a first capacitor coupled between the source of the second transistor and the drain of the second transistor;
a second resistor coupled between the first node and the second node, wherein the second node is configured to provide an output signal;
a third transistor having a drain coupled to the second node and a source coupled to ground;
a fourth transistor having a drain coupled to the first node and a source coupled to a gate of the third transistor;
a second capacitor configured to couple the drain of the fourth transistor to the source of the fourth transistor;
a first bias circuit, comprising:
a fifth transistor having a source, a gate, and a drain, wherein the source of the fifth transistor is coupled to ground and the gate of the fifth transistor is coupled to the drain of the fifth transistor; and
a sixth transistor having a source, a gate, and a drain, wherein the source of the sixth transistor is coupled to the drain of the fifth transistor and the gate of the sixth transistor is coupled to the drain of the sixth transistor and the gate of the fourth transistor; and
a second bias circuit comprising:
a seventh transistor having a source, a gate, and a drain, wherein the source of the seventh transistor is coupled to a power supply and the gate of the seventh transistor is coupled to the drain of the seventh transistor; and
an eighth transistor having a source, a gate, and a drain, wherein the source of the eighth transistor is coupled to the drain of the seventh transistor and the gate of the eighth transistor is coupled to the drain of the eighth transistor and the gate of the second transistor.

* * * * *